(12) United States Patent
Schubert

(10) Patent No.: US 11,362,628 B2
(45) Date of Patent: Jun. 14, 2022

(54) INPUT STAGE FOR AN LVDS RECEIVER CIRCUIT

(71) Applicant: Robert Bosch GmbH, Stuttgart (DE)

(72) Inventor: Andreas Schubert, Coswig (DE)

(73) Assignee: Robert Bosch GmbH, Stuttgart (DE)

( * ) Notice: Subject to any disclaimer, the term of this patent is extended or adjusted under 35 U.S.C. 154(b) by 106 days.

(21) Appl. No.: 16/636,581

(22) PCT Filed: Jun. 22, 2018

(86) PCT No.: PCT/EP2018/066787
§ 371 (c)(1),
(2) Date: Feb. 4, 2020

(87) PCT Pub. No.: WO2019/029890
PCT Pub. Date: Feb. 14, 2019

(65) Prior Publication Data
US 2021/0399723 A1    Dec. 23, 2021

(30) Foreign Application Priority Data
Aug. 8, 2017  (DE) .......................... 102017213732.0

(51) Int. Cl.
*H03F 3/45* (2006.01)
*H03K 5/24* (2006.01)
*H03K 19/0185* (2006.01)

(52) U.S. Cl.
CPC ..... *H03F 3/45183* (2013.01); *H03F 3/45192* (2013.01); *H03F 3/45708* (2013.01); *H03K 5/2481* (2013.01); *H03K 19/018528* (2013.01); *H03F 2203/45674* (2013.01)

(58) Field of Classification Search
CPC ............. H03F 3/45183; H03F 3/45192; H03F 3/45708; H03F 2203/45674; H03K 5/2481; H03K 19/018528
USPC .................................................. 330/252-261
See application file for complete search history.

(56) References Cited

U.S. PATENT DOCUMENTS

| | | |
|---|---|---|
| 2002/0075074 A1 | 6/2002 | Wang |
| 2009/0086857 A1 | 4/2009 | Wu |
| 2011/0298541 A1 | 12/2011 | Shi |

OTHER PUBLICATIONS

International Search Report for PCT/EP2018/066787, dated Sep. 18, 2018.

*Primary Examiner* — Khanh V Nguyen
*Assistant Examiner* — Khiem D Nguyen
(74) *Attorney, Agent, or Firm* — Norton Rose Fulbright US LLP; Gerard Messina

(57) ABSTRACT

An input stage for an LVDS receiver circuit is provided, which includes at least one supply voltage connection as well as a first and a second stage input to be acted upon by a differential input signal pair. The input stage further includes a first and a second differential stage, the stage inputs being directly connected to one input each of the first differential stage and indirectly, via one level-shifting circuit each, to one input each of the second differential stage. According to the present invention, the first and the second differential stage are connected to the supply voltage connection via one transistor each of a third differential stage, the control input of one of these transistors being connected to a measuring path connecting the stage inputs to one another, with the control input of the other transistor being connected to an apparatus/device (arrangement) for providing a reference voltage.

12 Claims, 7 Drawing Sheets

110

INPUT STAGE FOR AN LVDS RECEIVER CIRCUIT

FIELD OF THE INVENTION

The present invention relates to an input stage for an LVDS receiver circuit, which includes at least one supply voltage connection, one first and one second stage input to be acted upon by a differential input signal pair and a first and a second differential stage. The stage inputs of the input stage are directly connected to one input each of the first differential stage and indirectly to one input each of the second differential stage via a level-shifting circuit. The input stage further includes two stage outputs, each of which includes a connection from one output each of the first and of the second differential stage.

BACKGROUND INFORMATION

So-called LVDS (low-voltage differential signaling) systems, often also referred to as systems based on a low voltage differential signal transmission, have been employed already as early as the 1990s for the rapid and serial transmission of digital signals. In these systems, the signals are transmitted differentially via a wire pair with—compared to the signal transmission, for example, in CMOS systems—a sharply reduced signal amplitude. Such a signal transmission allows for a significantly higher transmission speed as well as a lower spurious emission compared to CMOS systems, since significantly less charge is required for the change between the 0 and 1 states.

An exemplary LVDS system 300 of the related art is depicted in FIG. 1. In simplified terms, LVDS system 300 includes an LVDS transmission stage 200, which includes a power source 202 and, in this example, four transistors 201, of which two each are connected in series. Power source 202 is held in its operating point with the aid of a so-called bias circuit. Power source 202 in this example supplies a low current of approximately 3.5 mA. It may, however, supply an arbitrary other current.

As mentioned, power source 202 is connected to a parallel circuit made up of two series circuits, each of which includes two transistors 201 connected in series. Within a series circuit, transistors 201 of the series circuit are activated with voltages of different amounts, which is expressed in FIG. 1 by different signs in front of the gate inputs of transistors 201. In this case, the signs of the voltages present at the transistors differ alternatingly clockwise, so that opposing voltages drop between transistors 201 of the series circuits in relation to common mode voltage $V_{CM}$ (see below). Whereas a positive voltage $V_P$ drops between the transistors of one of the series circuit in relation to common mode voltage $V_{CM}$ in the situation shown in FIG. 1, a negative voltage $V_N$ drops between the transistors of the other series circuits, again in relation to common mode voltage $V_{CM}$. LVDS transmission stage 201 is connected between transistors 201 of the series circuits to one signal line 151, 152, each, via which the differential signal transmission is enabled. The signals transmitted via these signal lines 151, 152 are schematically depicted in FIG. 2. They form a so-called impedance-controlled transmission path. Also schematically indicated in FIG. 1 is how electrical field 140 occurring during a signal transmission between signal lines 151, 152 stands out, i.e. electrical field 140 is represented in a cross section 143 by signal lines 151, 152 which form a signal line pair. Signal lines 151, 152 are connected at the end on the receiver side to a termination resistor 160, across which a voltage drops, which is used, evaluated and or further processed by an LVDS receiver circuit 100 electroconductively connected to signal lines 151, 152.

The differential transmission takes place in order to counteract the increase in interference susceptibility of the signal transmission that accompanies the reduction of the signal amplitude. Differential signal transmission means that the information to be transmitted is transmitted only via the voltage difference between the two signal lines. In such a transmission, interferences that impact the common mode of the signals, i.e., impair both signals or the signals in both signal lines equally, are largely suppressed.

A typical signal curve of an LVDS transmission of the related art on the receiver side is depicted in FIG. 2, as it occurs, for example, in LVDS receiver circuit 100 shown in FIG. 1. In general, voltage U in this case is plotted against time t. The curve of a first signal of a signal pair is depicted against time t by the solid line on top in FIG. 2, which is transmitted via second signal line 152 in the example from FIG. 1. The curve of a second signal of the signal pair is depicted against time t by the dashed line on top in FIG. 2, which is transmitted via first signal line 151 in the example from FIG. 1. Depicted therebetween by a dot-dashed line is the curve of common mode voltage $V_{CM}$, which is calculated according to the formula $V_{CM}=0.5*(V_P+V_N)$, $V_P$ being the first signal—also referred to as a positive signal—and $V_N$ being the second signal—also referred to as a negative signal. In range S, the influence of an interference, in this example, of a so-called ground offset, on the curve of positive signal $V_P$, of negative signal $V_N$, and of common mode voltage $V_{CM}$, is depicted. The cause of the depicted interference is not apparent in FIG. 2. In addition to a ground offset as a cause, other interferences, for example, directly coupled interference or interference in the transmission stage, may also be causative.

Depicted below this (centrally in FIG. 2) is the curve of differential input signal $V_{ID}$ of LVDS receiver circuit 100 resulting from positive signal $V_P$ and negative signal $V_N$ according to formula $V_{ID}=V_P-V_N$. The common mode suppression on the receiver side—i.e., LVDS receiver circuit 100—ensures that the interference in range S has no influence on the curve of differential input signal $V_{ID}$ of LVDS receiver circuit 100. Depicted at the bottom of FIG. 2 is the curve of received digital signal resulting from differential input signal $V_{ID}$ of LVDS receiver circuit 100.

According to the present standard, an LVDS transmission stage must ensure a reliable operation for a defined common mode of the signals. However, significant interferences of the common mode may occur as a result of couplings on the signal line pairs or as result of the ground offset depicted in FIG. 2 (see range S in FIG. 2), particularly during the communication between two devices. For a robust operation, the common mode range of an LVDS receiver circuit must therefore be significantly larger than the common mode range of the LVDS transmission stage. Ideally then, the admissible common mode of the LVDS receiver circuit extends from its ground potential to its supply voltage.

Various approaches or circuit concepts are known in the related art, which are aimed at ensuring such a common mode range, or to achieve at least an approximation of such a common mode range. One of the most frequently employed circuit concepts is shown in FIG. 3. This involves a comparator having a so-called PMOS input stage. The circuit shown in FIG. 3 is also known as a widespread comparator circuit with a PMOS input stage.

Input stage 60 of an LVDS receiver circuit 110 of the related art depicted in FIG. 3 (not explicitly depicted in FIG.

3) includes a differential stage 59, at the inputs of which a differential input signal pair is present. Input common mode voltage $V_{CM}$ of input signal pair $V_P$, $V_N$ is largely suppressed with the aid of differential stage 59 and the present differential voltage is processed. The differential signal is converted into a digital signal with the aid of an active load—implemented here as NMOS transistors connected at the $V_{ss}$ node, and with the aid of the current mirrors activated via the active load, i.e. the PMOS transistors at the $V_{DD}$ node. Differential stage 59 is electro-conductively connected to a power source 58 configured here as a PMOS transistor.

With a suitable dimensioning of the active load, it is possible to adjust as needed a hysteresis for the input of a comparator of LVDS receiver circuit 110. The disadvantage of this circuit topology is in the unilaterally limited common mode range. The lower limit of the common mode at the input may—depending on the dimensioning—reach almost to the ground potential of the circuit. The common mode upper limit of input stage 60 depicted in FIG. 3 is limited to a voltage that is smaller than $V_{DD}-(|V_{DSsat}|+|V_{GS}|)$, $V_{DD}$ corresponding to a supply voltage provided to input stage 60. $V_{DSsat}$ corresponds to the drain source voltage of the active load in saturation, whereas $V_{GS}$ of the gate source voltage corresponds to the active load. In other words, $V_{DSsat}$ is the saturation voltage, i.e. the drain source voltage, which is required in order to at least operate power source 58. Normally, |VDS|>|VDSsat|. At lower voltages, the transistor no longer operates as a power source. In its behavior, it then resembles a resistor. The sum of $|V_{DSsat}|+|V_{GS}|$ may amount to quite more than 1.5 V and represents a significant limitation in the case of the required low operating voltages (typically 2.4 V-3.3 V) of modern process technologies.

The unilateral limitation of the admissible common mode voltage may be canceled by a rail-to-rail input stage, as it is depicted in FIG. 4. In other words, FIG. 4 shows a comparator circuit having a rail-to-rail input stage of the related art. In this topology the input common mode ranges of a PMOS differential stage 71 and an NMOS differential stage 72 are superimposed, so that the potential common mode range extends overall from $V_{ss}$ to $V_{DD}$. The respective common mode ranges in this case must be large enough that they sufficiently overlap in the middle between $V_{DD}$ and $V_{SS}$.

A disadvantage in this case is the strong common mode dependency of the amplification. In proximity to $V_{DD}$ or $V_{SS}$ either only the NMOS transistor pair of NMOS differential stage 72 or only the PMOS transistor pair of PMOS differential stage 71 contributes to amplification. This means only the respective transconductance of transistors $Gm_{PMOS}+Gm_{NMOS}$ and not the sum of transconductances $Gm_{PMOS}+Gm_{NMOS}$ of the transistors is available. This results in a lower amplification and in longer delay times. The use of additional so-called constant Gm control circuits may compensate for this disadvantage, but it increases the power demand significantly. A further disadvantage is in the significantly impaired feasibility of a well-defined hysteresis.

Another topology of an input stage for an LVDS receiver of the related art having a wide input common mode range is shown in FIG. 5. This topology includes a parallel circuit of two PMOS differential stages 81, 82, each of which includes two PMOS transistors 81-1, 81-2, 82-1, 82-2. The significant feature here is that second of PMOS differential stages 82 is not connected directly, i.e., not connected directly to differential inputs $V_P$ and $V_N$ of the input stage— also referred to as stage inputs—but that a level-shifting variant of signals $V_P$, $V_N$ is present at the inputs of second PMOS differential stage 82 during the operation of the circuit. The level shifting is implemented by level-shifting circuits, i.e., by so-called follower circuits 91, 92, each of which includes a transistor 91-1, 92-1 and each a load resistor 91-2, 92-2. The second of differential stages 82, since it is connected via the switching path of a further transistor 83 to the supply voltage $V_{DD}$ of the input stage, results in the common mode upper limit of $V_{DD}-(|V_{DSsat83}|+|V_{GS82-1}|-V_{GS91-1})$. $V_{DSsat83}$ in this case corresponds to the drain source saturation voltage of additional transistor 83, $V_{GS82-1}$ corresponds to the gate source voltage of first transistor 82-1 of second PMOS differential stage 82 and $V_{GS91-1}$ corresponds to the gate source voltage of transistor 91-1 of follower circuit 91, to which first transistor 82-1 of second PMOS differential stage 82 is electro-conductively connected. With a suitable dimensioning of the components applied in the input stage, the aforementioned term in the brackets virtually disappears and a common mode range as in the topology in FIG. 4 is achieved.

A disadvantage of this concept is the definition of the operating points of transistors 82-1, 82-2, 91-1 and 92-1. The input common mode, i.e., the common mode voltage $V_{CM}$ is measured with the aid of terminating resistors 94 and 96. This voltage is utilized in order to adjust the operating point current from transistors 82-1, 82-2 of second PMOS differential stage 82 with the aid of an adjustment transistor 97 as well as a current mirror 98, current mirror 98 including a mirror transistor 98-1 as well as additional transistor 83. The resulting current is a function not only of common mode voltage $V_{CM}$, but also of the difference based on the supply voltages of input stage $V_{DD}$-$V_{SS}$, on the temperature and on the processing state.

Similar dependencies also apply to the operating point currents of transistors 91-1, 92-1 of follower circuits 91, 92. In addition, follower circuits 91, 92 attenuate the input signal by approximately a factor of 0.7 and thus ensure greater common mode voltages for decreasing the level-shifted differential signals. All of this means that here the current consumption and thus the hysteresis and the delay time are a function of the common mode voltage and of other parameters—for example, of $v_{DD}$, temperature and processing state.

SUMMARY OF THE INVENTION

According to the present invention, an input stage for an LVDS receiver circuit is provided, which includes at least one supply voltage connection, as well as one first and one second stage input to be acted upon by a differential input signal pair. The input stage further includes one first and one second differential stage, the stage inputs being directly connected to one input each of the first differential stage and indirectly to one input each of the second differential stage via one level-shifting circuit each. The input stage further includes two stage outputs, each of which includes a connection from one output each of the first and of the second differential stage. According to the present invention, the first and the second differential stage are connected to the supply voltage connection via one transistor each of a third differential stage, the control input of one of these transistors being connected to a measuring path connecting the stage inputs to one another, whereas the control unit of the other transistor is connected to an apparatus/device (arrangement) for providing a reference voltage.

The advantage of such an input stage is in the reduction or in the elimination of the problem areas referred to in connection with, in particular, the previously described circuits and input stages. The input stage according to the present invention enables, in particular, a maximization of the permitted common mode range and at the same time the elimination of the dependency of critical circuit parameters such as, for example, the power consumption or the delay time of the common mode.

The transistor of the third differential stage connected to the measuring path may be directly, i.e., directly electro-conductively, connected to the first differential stage. The transistor of the third differential stage connected to the apparatus/device (arrangement) for providing a reference voltage may further be connected, i.e. directly electro-conductively connected, to the second differential stage.

Thus, the input stage may include a third differential stage, from which a first transistor is electro-conductively connected to the first differential stage and from which a second transistor is electro-conductively connected to the second differential stage. The switching paths of the transistors of the third differential stage are each electro-conductively connected to the supply voltage connection.

A first output of the first differential stage and a first output of the second differential stage may be electro-conductively connected to a first stage output of the input stage. A second output of the first differential stage and a second output of the second differential stage may be electro-conductively connected to a second stage output of the input stage.

In addition, the first and/or the second and/or the third differential stage(s) each include two transistors, which are each electro-conductively connected to one another at their drain connections or at their source connections.

The reference voltage provided by the apparatus/device (arrangement) for providing a reference voltage corresponds to a pre-adjusted constant voltage, which is identical to a common mode voltage $V_{CM\_REF}$ predetermined, optimal or desired and/or adapted to the input stage. The apparatus/device (arrangement) for providing a reference voltage may include a reference voltage source. The apparatus/device (arrangement) for providing a reference voltage further may include a resistor at which the reference voltage drops.

The transistors of the first and/or of the second and/or of the third differential stage(s) may be all transistors of one type, in particular, configured as PMOS field effect transistors. The type of a transistor may be meant to be its configuration, its dimensioning, i.e., its geometry, the technology and functionality of the transistor and/or its production method.

Such input stages may be simply, cost-effectively and compactly produced compared to other configurations and enable a simple activation as compared to other circuit typologies.

The measuring path connecting the stage inputs to one another may include a series circuit made up of two identical resistors, the control input of the transistor of the third differential stage connected to the measuring path being electro-conductively connected to the measuring path between the resistors of the series circuit. In such a configuration, common mode voltage $V_{CM}=0.5*(V_P+V_N)$ of a differential input signal pair occurs between the identical resistors, which thus activates the transistor of the third differential stage connected to the measuring path. In combination with the activation of the other transistor of the third differential stage via the reference voltage, the base current of the input stage is advantageously provided either at the first or at the second differential stage. Ideally, that is, without any tolerance of the components, the base currents of the first and of the second differential stage are identical for the case $V_{CM}=V_{CM\_REF}$. Regardless of the above, the sum of these two base currents always corresponds to the base current of the third differential stage. The base current of the third differential stage is divided into the first and second differential stage as a function of the difference $V_{CM}-V_{CM\_REF}$. The measuring path further may include only one resistor or more than two resistors, the arrangement and dimensioning of the resistors of the measuring path being such that common mode voltage $V_{CM}=0.5*(V_P+V_N)$ of a differential input signal pair is provided at the point of the measuring path at which the control input of the transistor of the third differential stage is electro-conductively connected to the measuring path. Thus, when the stage inputs are acted upon by a differential input signal pair, common mode voltage $V_{CM}$ of the differential input signal pair may drop between the identical resistors of the measuring path.

The identical resistors may correspond to terminating resistors of signal lines connected to the input stage.

In one specific embodiment, the switching paths of the transistors of the third differential stage are connected via the switching path of an additional transistor to the supply voltage connection. In such a specific embodiment, the additional transistor advantageously functions as a base power source. In other words, the base current in such a configuration is provided via the additional transistor. Thus, the switching paths of the transistors of the third differential stage may be electro-conductively connected to a base power source. The base power source may be connected to the supply voltage connection. The switching paths of the transistors of the third differential stage may further be connected via a resistor to the supply voltage connection. In addition, the transistors of the third differential stage may be each connected in series to an additional transistor, which in turn is electro-conductively connected to the supply voltage connection of the input stage. The source connections or the drain connections of the transistors of the third drain stage may be electro-conductively connected to the source connection or to the drain connection of an additional transistor, the connection of the additional transistor not connected to the transistors of the third differential stage being electro-conductively connected to the supply voltage connection of the input stage.

A first of the level-shifting circuits may include a first series circuit made up of two transistors, the first end of the first series circuit being electro-conductively connected to the supply voltage connection. The control inputs of the transistors of the first series circuit may further be electro-conductively connected to one of the stage inputs each, and the first of the inputs of the second differential stage is electro-conductively connected to the first series circuit between the transistors of the first series circuit. In such a specific embodiment, the first level-shifting circuit is configured as a simple follower circuit, which enables a level shifting at the first input of the second differential stage in a simple manner.

The second of the level-shifting circuits may include a second series circuit made up of two transistors, the first end of the second series circuit being electro-conductively connected to the supply voltage connection and the control inputs of the transistors of the second series circuit being electro-conductively connected to one stage input each. The second of the inputs of the second differential stage may further be electro-conductively connected to the second series circuit between the transistors of the second series circuit. In such a specific embodiment the second level-shifting circuit is also configured as a simple follower circuit, which enables a level shifting at the second input of the second differential stage in a simple manner. In such a configuration, differential signal $V_P$–$V_N$ is present directly at the transistors of the first differential stage and is provided level-shifted at the transistors of the second differential stage via transistors of the level-shifted circuits. The first and the second differential stage assume the actual signal processing, that is, the common mode suppression, the difference formation as well as the amplification of the positive and of the negative signal of the differential input signal pair. The active load and a subsequent amplifier stage/comparator stage further may also contribute to the amplification. In addition, the active load ensures the desired hysteresis. An additional signal processing, i.e., an additional amplification, hysteresis and a level adaptation at the output as needed may be enabled by additional or other components.

In one specific embodiment, the second end of the first series circuit and the second end of the second series circuit are electro-conductively connected to the switching path of a transistor of a current mirror circuit. In such a configuration, the operating point of the level-shifting circuits, i.e., the operating point of the follower circuits for the required level shifting, is set by the current mirror. The transistor of the current mirror circuit may function as a power source, which ensures that the current for the level-shifting circuits, i.e., the follower circuits, is common mode-independent.

The input stage further may include a second supply voltage connection, the current mirror circuit being electro-conductively connected to the second supply voltage connection. The second supply voltage connection may be electro-conductively connected to a ground potential. In this configuration, the circuit is electro-conductively connected to two fixed potentials.

In one specific embodiment, the transistor of the first and/or of the second series circuit are all configured as transistors of one type, in particular, as NMOS field effect transistors. In such a configuration, it is possible to manufacture the level-shifting circuits in a simple, cost-effective and particularly compact manner. In principle, a suitable level shifting may be achieved only with transistors that are of a complementary type of the first three differential stages. These may be NMOS transistors. The entire circuit may further be configured in CMOS technology, i.e. the first three differential stages are implemented with NMOS transistors and the level shifting is accordingly implemented with PMOS transistors. This circuit may further be implemented with bipolar transistors i.e., with NPN transistors and PNP transistors.

An LVDS receiver circuit may further be provided with an input stage according to the present invention. In such an LVDS receiver circuit, the advantages mentioned previously in connection with the input stage according to the present invention come into play.

The term connected in the context of this disclosure particularly may mean electro-conductively connected, i.e., a connection between two components corresponds to an electro-conductive connection of these components.

Advantageous refinements of the present invention are specified herein and described in the description.

Exemplary embodiments of the present invention are explained in greater detail with reference to the drawings and to the following description.

DETAILED DESCRIPTION

Figure 1:
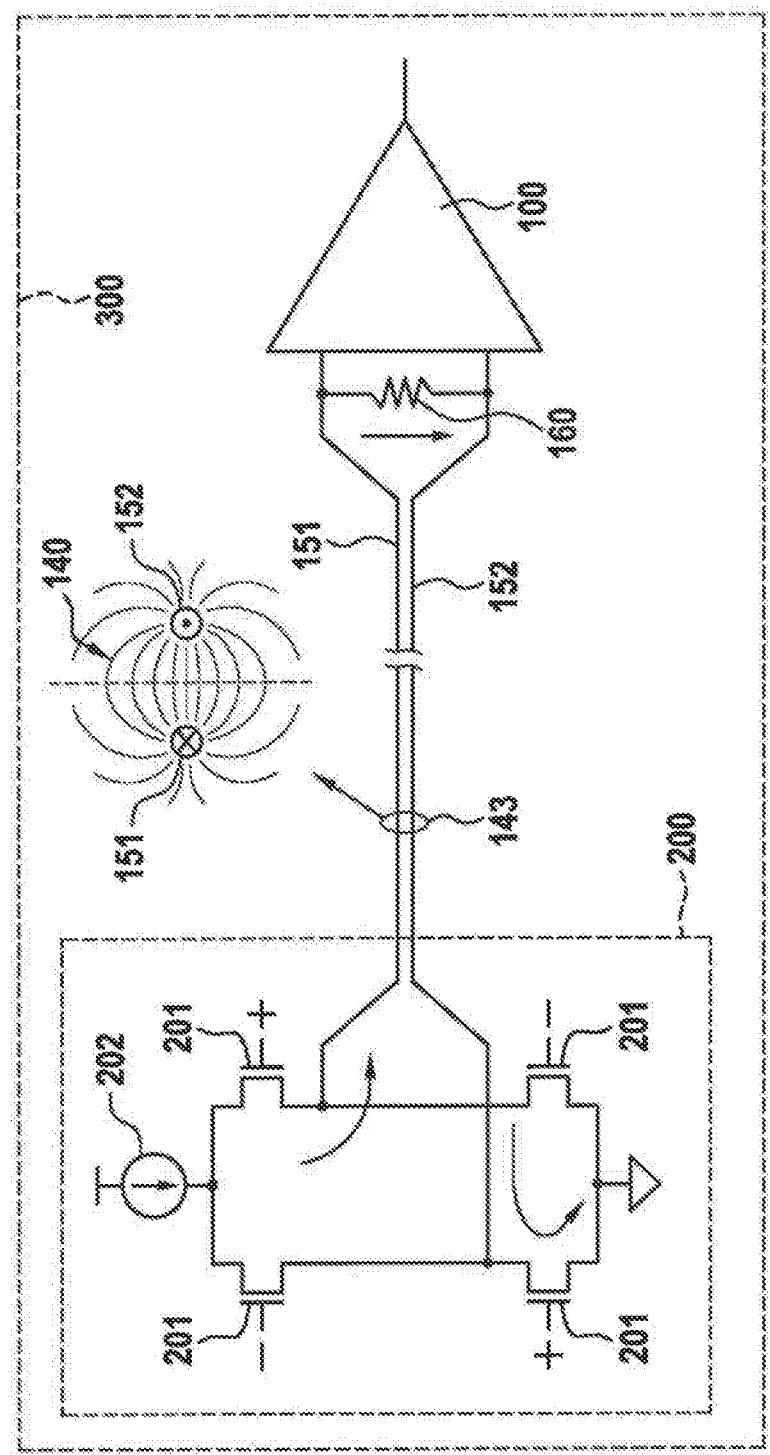
FIG. 1 shows an exemplary LVDS system of the related art.
Figure 2:
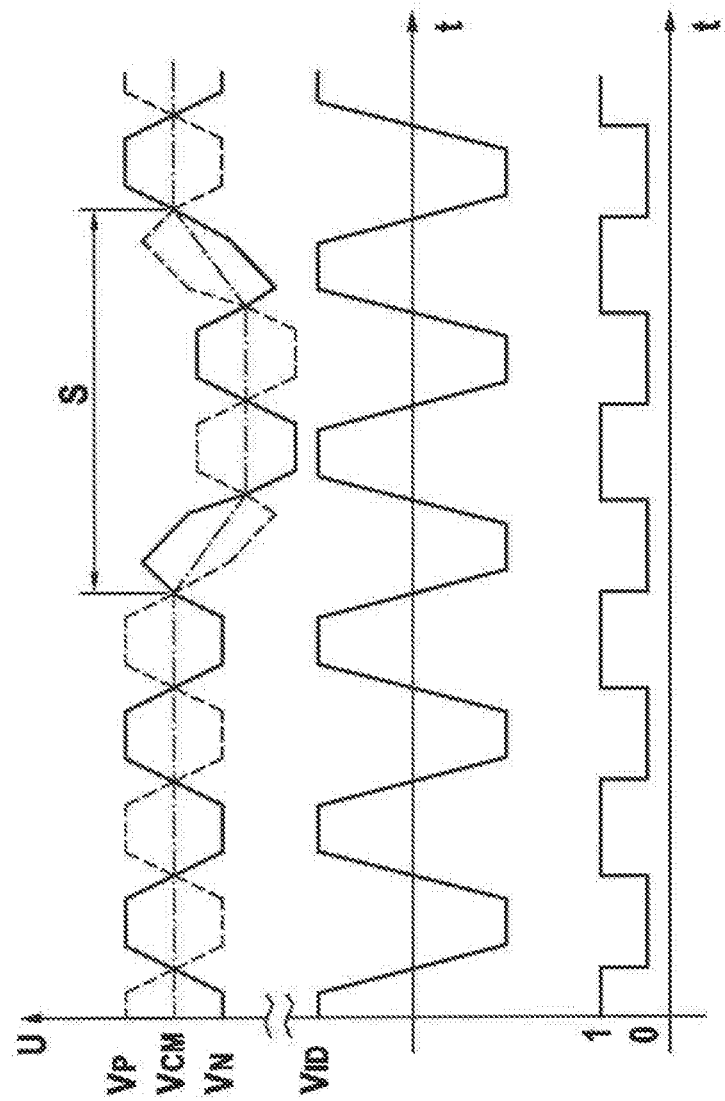
FIG. 2 shows a typical signal curve of an LVDS transmission of the related art on the receiver side.
Figure 3:
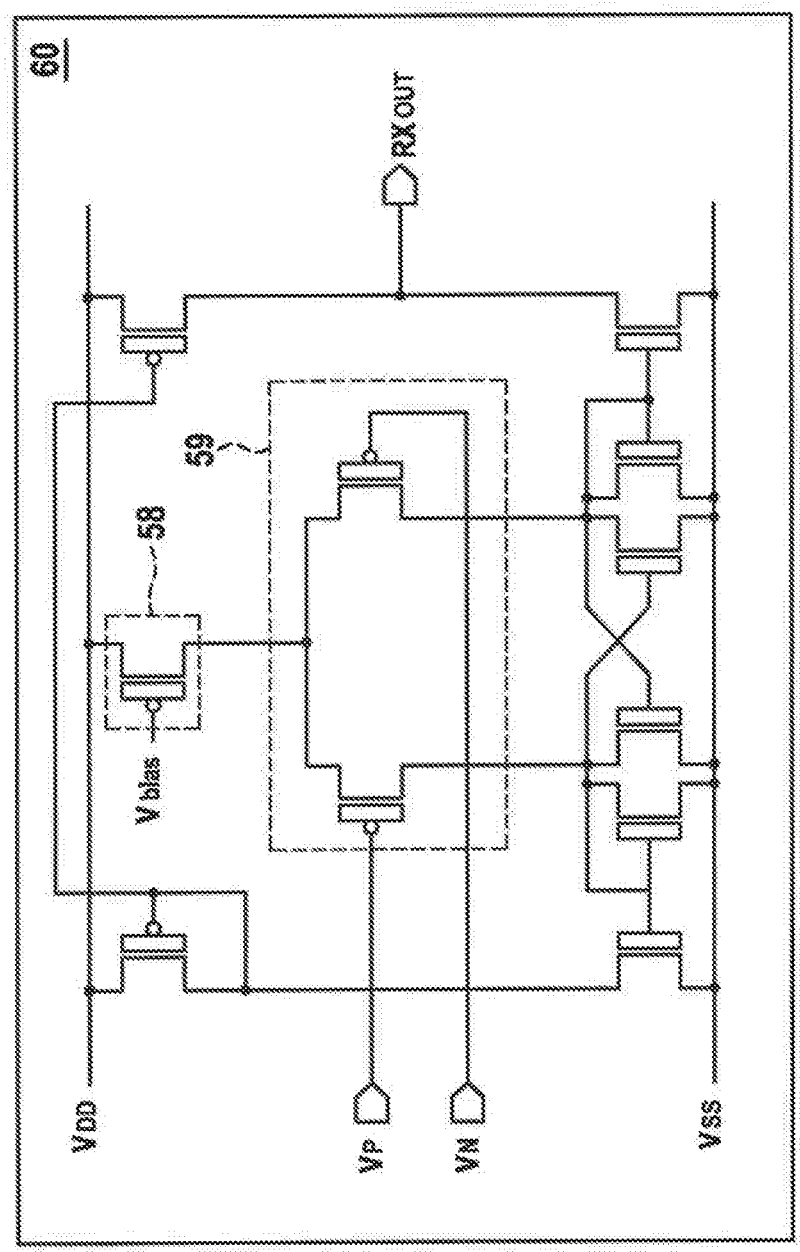
FIG. 3 shows an input stage of an LVDS receiver circuit of the related art.
Figure 4:
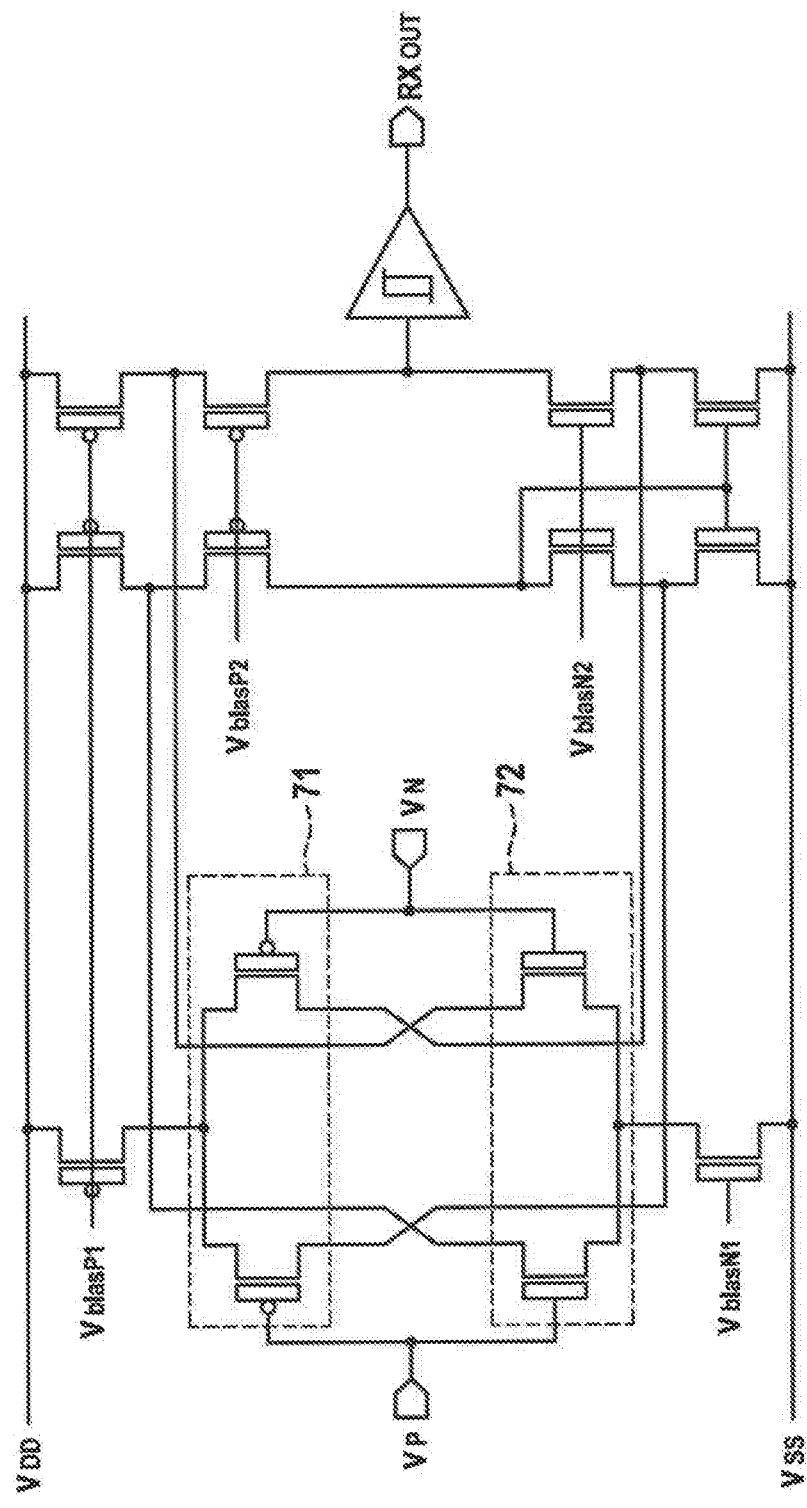
FIG. 4 shows a comparator circuit including a rail-to-rail input stage of the related art.
Figure 5:
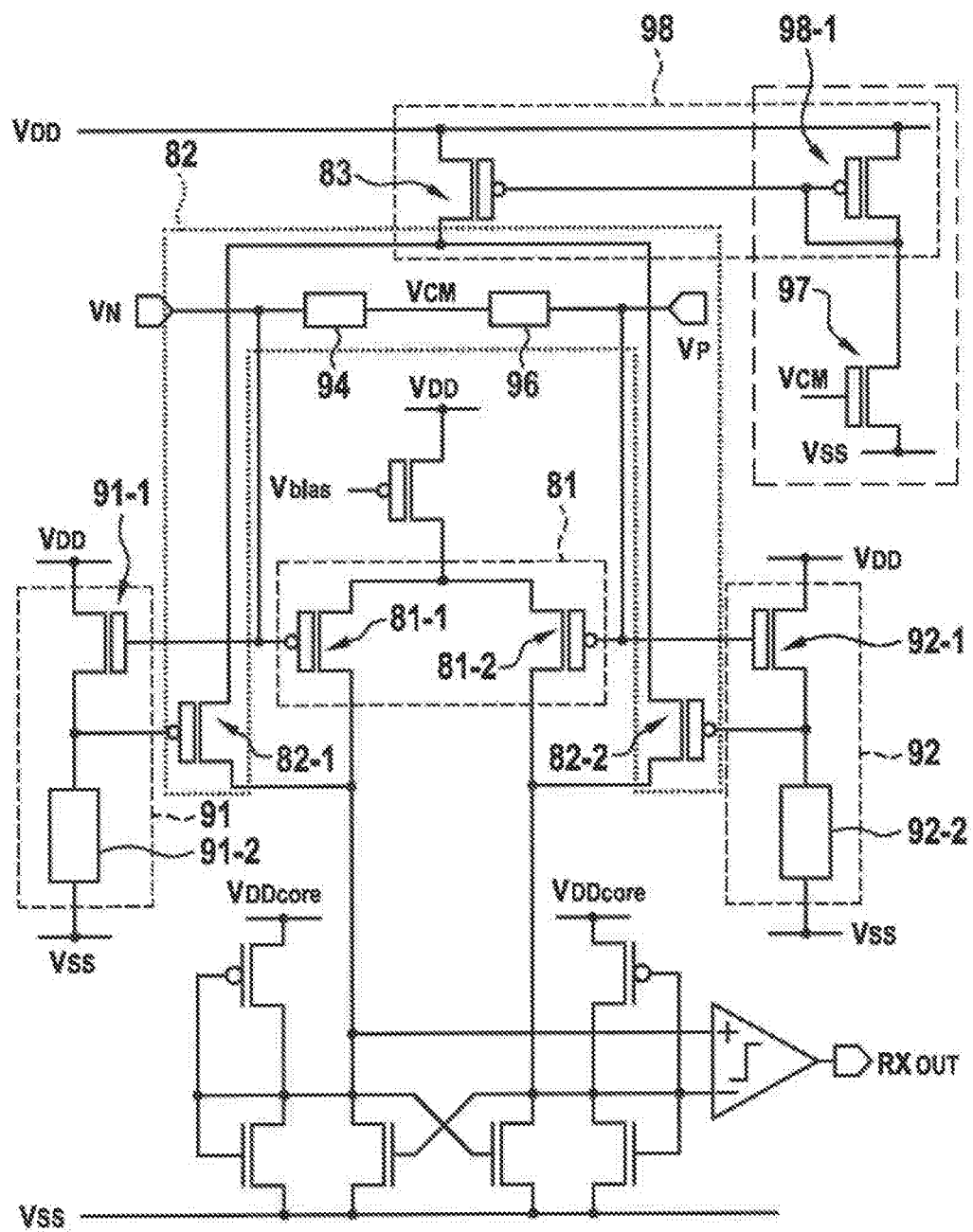
FIG. 5 shows another topology of an input stage for an LVDS receiver of the related art having a wide input common mode range.
Figure 6:
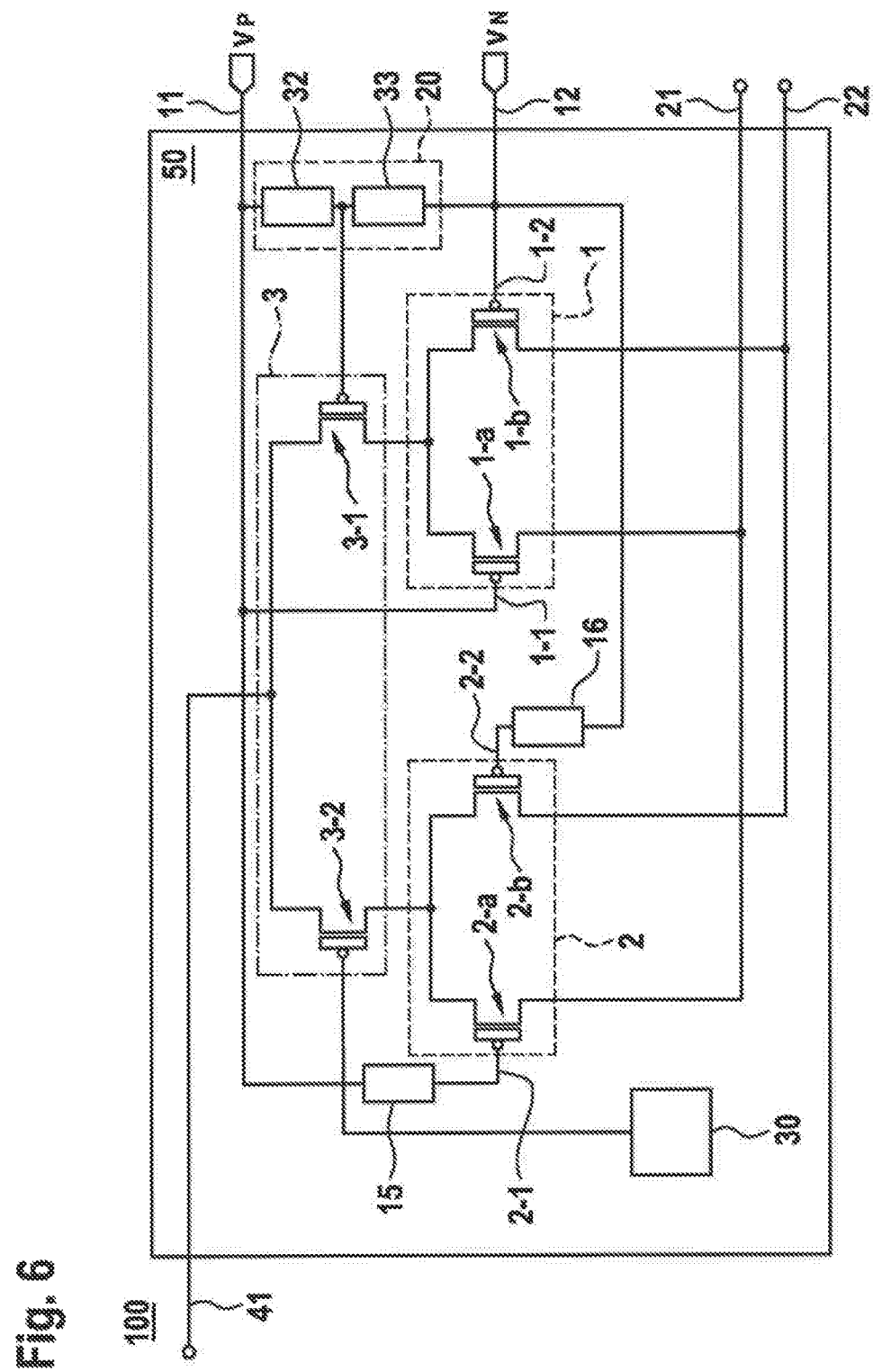
FIG. 6 shows a first exemplary embodiment of an input stage according to the present invention.

A first exemplary embodiment of an input stage 50 for an LVDS receiver circuit 100 is shown in FIG. 6. LVDS receiver circuit 100 itself is not depicted, but merely indicated by a frame. In this exemplary embodiment, input stage 50 includes a supply voltage connection 41, at which a supply voltage source is connectable for providing a supply voltage potential $V_{DD}$. Input stage 50 according to the present invention further includes a first and a second stage input 11, 12 to be acted upon by a differential input signal pair. Stage inputs 11, 12 are connectable, for example, with signal lines 151, 152 as depicted in FIG. 1.

Input stage 50 further includes a first and a second differential stage 1, 2, stage inputs 11, 12 being directly connected to one input 1-1, 1-2 each of first differential stage 1, and indirectly to one input 2-1, 2-2 each of second differential stage 2, via one level-shifting circuit 15, 16 each. Both first as well as the second differential stage 1, 2 in this exemplary embodiment include two transistors 1-a, 1-b, 2-a, 2-b, both the transistors 1-a, 1-b of first differential stage 1 as well as transistors 2-a, 2-b of second differential stage 2 in this exemplary embodiment being connected to one another, merely by way of example, to their source connections. The control inputs, that is, the gate connections of transistors 1-a, 1-b of first differential stage 1 form inputs 1-1, 1-2 of first differential stage 1. The control inputs, that is, the gate connections of transistors 2-a, 2-b of second differential stage 2 form inputs 2-1, 2-2 of second differential stage 2. More precisely, first input 1-1 of first differential stage 1 is formed by the control input of first transistor 1-a of first differential stage 1. Second input 1-2 of first differential stage 1 is formed by the control input of second transistor 1-b of first differential stage 1. First input 2-1 of second differential stage 2 is formed by the control input of first transistor 2-a of second differential stage 2. Second input 2-2 of second differential stage 2 is formed by the control input of second transistor 2-b of second differential stage 2.

In this first exemplary embodiment, the drain connections of transistors 1-a, 1-b of first differential stage 1 form, merely by way of example, the outputs of first differential stage 1, whereas the drain connections of transistors 2-a, 2-b of second differential stage 2 form, merely by way of example, the outputs of second differential stage 2. More precisely, the drain connection of first transistor 1-a of first differential stage 1 forms the first output of first differential stage 1. Furthermore, the drain connection of second transistor 1-b of first differential stage 1 forms the second output of first differential stage 1. In addition, the drain connection of first transistor 2-a of second differential stage 2 forms the first output of second differential stage 2. Furthermore, the drain connection of second transistor 2-b of second differential stage 2 forms the second output of second differential stage 2.

In other exemplary embodiments of input stages according to the present invention, the outputs of the differential stages may, however, each also be formed by the source connections of the transistors of the differential stage, so that the transistors of a differential stage are interconnected at their drain connections. In this exemplary embodiment, first stage input 11 is connected, merely by way of example, directly to first input 1-1 of first differential stage 1 and indirectly to first input 2-1 of second differential stage 2 via a first level-shifting circuit 15. Second stage input 12 is further connected, merely by way of example, directly to second input 1-2 of first differential stage 1 and indirectly to second input 2-2 of second differential stage 2 via a second level-shifting circuit 16. In this exemplary embodiment, the two level-shifting circuits 15, 16 cause a change of the activation of first and second transistors 2-1, 2-2 of second differential stage 2 as a function of an input signal, which is described in greater detail in connection with FIG. 7.

Input stage 50 further includes two stage outputs 21, 22, each of which includes a connection from one output each of first and of second differential stage 1, 2. In other words, first stage input 21 in this first exemplary embodiment is formed, merely by way of example, by an electro-conductive connection from the first output of first and of second differential stage 1, 2, whereas second stage output 22 is formed by an electro-conductive connection from the second output of first and of second differential stage 1, 2. Again in other words, the first outputs of first and second differential stage 1, 2 are electro-conductively connected to first stage output 21, whereas the second outputs of first and second differential stage 1, 2 are electro-conductively connected to second stage output 22.

In addition, first and second differential stage 1, 2 in this exemplary embodiment are connected to supply voltage connection 41 via one transistor 3-1, 3-2 each of a third differential stage 3. In other words, the drain connection of a first transistor 3-1 of a third differential stage 3 is electro-conductively connected to the source connections of transistors 1-a, 1-b of first differential stage 1, whereas the drain connection of a second transistor 3-2 of third differential stage 3 is electro-conductively connected to the source connections of transistors 2-a, 2-b of second differential stage 2. The source connections of transistors 3-1, 3-2 of third differential stage 3 in this exemplary embodiment are connected to one another at the shared connection point to supply voltage connection 41 of input stage 50. In other words, the source connections of transistors 3-1, 3-2 of third differential stage 3 in this exemplary embodiment are each electro-conductively connected to supply voltage connection 41 of input stage 50.

In other exemplary embodiments, however, the choice of the connections of transistors 3-1, 3-2 may also be reversed, that is, the source connections of transistor 3-1, 3-2 of third differential stage 3 may also be connected to the source connections of transistors 1-a, 1-b, 2-a, 2-b of first and second differential stage 1, 2, whereas the drain connections of transistors 3-1, 3-2 of third differential stage 3 are electro-conductively connected to supply voltage connection 41 of input stage 50. In this exemplary embodiment, the control input of first transistor 3-1 of third differential stage 3 is connected to a measuring path 20 that connects stage inputs 11, 12 to one another, whereas the control input of second transistor 3-2 of third differential stage 3 is connected to a apparatus/device (arrangement) for providing a reference voltage 30.

In this exemplary embodiment, measuring path 20 electro-conductively connecting stage inputs 11, 12 to one another includes a series circuit made up of two resistors 32, 33, the control input of first transistor 3-1 of third differential stage 3 connected to measuring path 20 being electro-conductively connected to measuring path 20 between resistors 32, 33 of the series circuit. Resistors 32, 33 of measuring path 20 represent terminating resistors for signal lines connectable to input stage 50. Thus, common mode voltage $V_{CM}=(V_P+V_N)/2$ drops directly between resistors 32, 33 and, therefore, at the control input of first transistor 3-1 of third differential stage 3. However, other measuring paths may also be implemented, with the aid of which a drop in common mode voltage $V_{CM}=(V_P+V_N)/2$ is achieved directly between the resistors and, therefore, at the control input of first transistor 3-1 of third differential stage 3.

The apparatus/device (arrangement) for providing a reference voltage 30 in this exemplary embodiment is implemented, merely by way of example, as a voltage source, which is configured to provide a reference voltage $V_{CM\_REF}$ for common mode voltage $V_{CM}=(V_P+V_N)/2$. Thus, reference voltage $V_{CM\_REF}$ in this exemplary embodiment corresponds to the nominal value of common mode voltage $V_{CM}$, i.e., to common mode voltage $V_{CM}$ in a non-disrupted signal transmission. In this exemplary embodiment, transistors 1-1, 1-2, 2-1, 2-2, 3-1, 3-2 of first, second and third differential stage 1, 2, 3 are all configured as PMOS field effect transistors.

Figure 7:
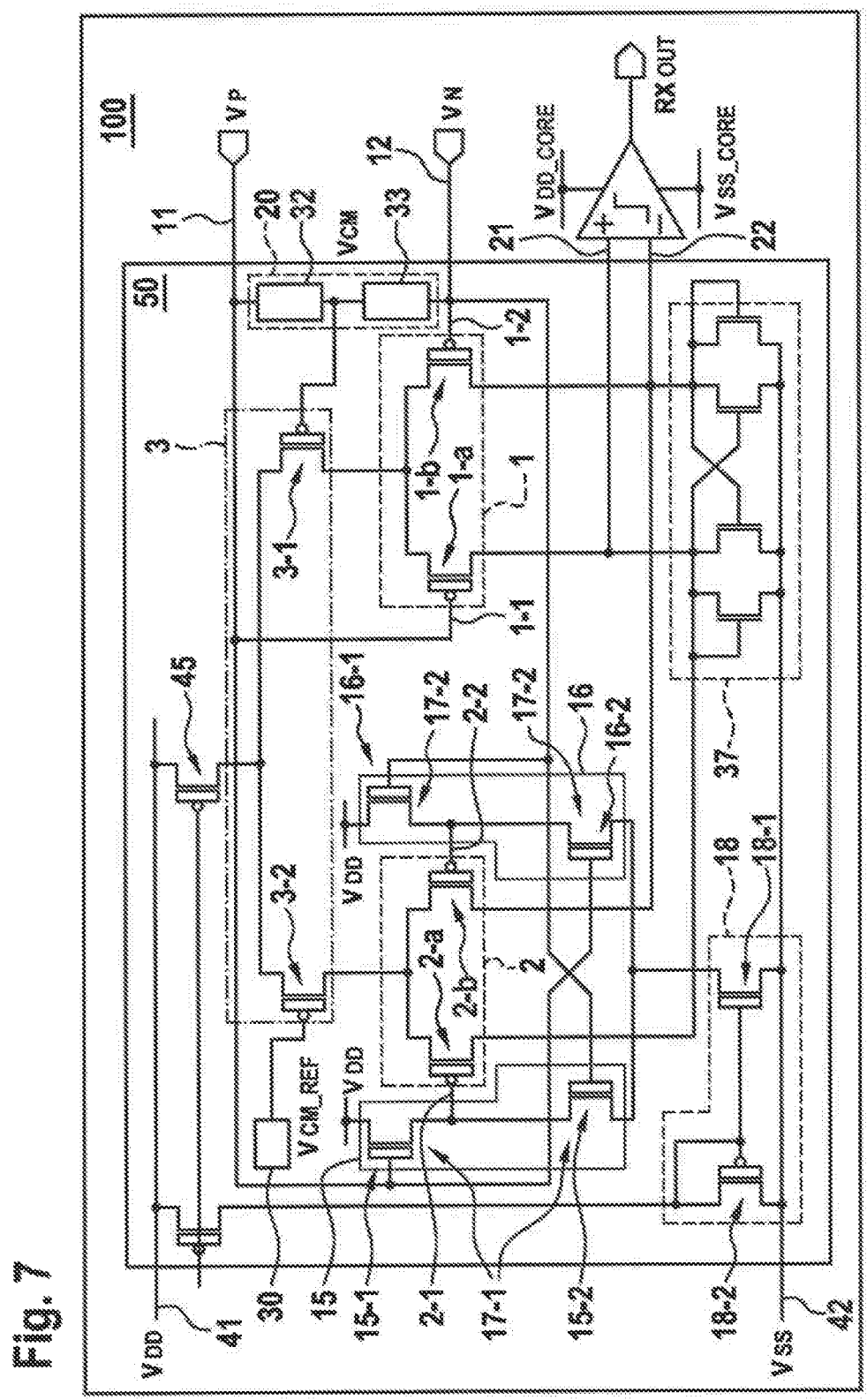
FIG. 7 shows a second exemplary embodiment of an input stage according to the present invention.

A second exemplary embodiment of an input stage 50 according to the present invention is depicted in FIG. 7. Input stage 50 shown in FIG. 7 represents a refinement of input stage 50 shown in FIG. 6, so that input stages 50 shown in FIGS. 6 and 7 largely coincide. The components identified similarly in FIGS. 6 and 7 correspond to the components identified accordingly in FIG. 6, so that the previous description regarding these components also applies to the similarly identified components in FIG. 7. Hence, the following description is limited to the differences or refinements of input stage 50 shown in FIG. 7.

In this second exemplary embodiment, the switching paths of transistors 3-1, 3-2 of third differential stage 3 are connected to supply voltage connection 41 via the switching path of an additional transistor 45. In this exemplary embodiment, the source connections of the two transistors 3-1, 3-2 of third differential stage 3 are not immediately or directly connected to supply voltage connection 41 of input stage 50, but to the drain connection of an additional transistor 45, whose source connection is electro-conductively connected to supply voltage connection 41 of input stage 50.

In addition, level-shifting circuits 15, 16 in this second exemplary embodiment are specifically configured. The first of level-shifting circuits 15 includes a first series circuit 17-1 made up of two transistors 15-1, 15-2, the first end of first series circuit 17-1 being electro-conductively connected to supply voltage connection 41. The control outputs of transistors 15-1, 15-2 of first series circuit 17-1 are electro-conductively connected to one each of stage inputs 11, 12. Furthermore, first input 2-1 of second differential stage 2 is electro-conductively connected to first series circuit 17-1 between transistors 15-1, 15-2 of first series circuit 17-1. First transistor 15-1 of first series circuit 17-1 is electro-conductively and directly connected to supply voltage connection 41, whereas second transistor 15-2 of first series circuit 17-1 is electro-conductively and directly connected to first transistor 15-1 of first series circuit 17-1. It is the control input of first transistor 15-1 of first series circuit 17-1 which is connected to first stage input 11, whereas the control input of second transistor 15-2 of first series connection 17-1 is connected to second stage input 12.

In addition, the second of level-shifting circuits 16 includes a second series circuit 17-2 made up of two transistors 16-1 16-2, the first end of second series circuit 17-2 being electro-conductively connected to supply voltage connection 41. The control inputs of transistors 16-1, 16-2 of second series circuit 17-2 are electro-conductively connected to one each of stage inputs 11, 12. The second of inputs 2-2 of second differential stage 2 is electro-conductively connected to first series circuit 17-2 between transistors 16-1, 16-2 of second series circuit 17-2. First transistor 16-1 of second series circuit 17-2 is electro-conductively and directly connected to supply voltage connection 41, whereas second transistor 16-2 of second series circuit 17-2 is electro-conductively and directly connected to first transistor 16-1 of second series circuit 17-2. It is the control input of second transistor 16-2 of second series circuit 17-2, which is connected to first stage input 11, whereas the control input of first transistor 16-1 of second series circuit 17-2 is connected to second stage input 12. The electro-conductive connection between the first ends of series circuit 17-1, 17-2 and supply voltage connection 41 is only suggested in FIG. 7. In other exemplary embodiments of input stages according to the present invention, however, the first ends of first and second series circuit 17-1, 17-2 may also be connected to separate connections, at which the potential is present which is also present at supply voltage connection 41.

In this second exemplary embodiment, the second end of first series circuit 17-1 and the second end of second series circuit 17-2 are further electro-conductively connected to the switching path of a first transistor 18-1 of a current mirror circuit 18, input stage 50 further including a second supply voltage connection 42, to which current mirror circuit 18 is electro-conductively connected. In this exemplary embodiment, the ground potential is present, merely by way of example, at second supply voltage connection 42. An arbitrary other potential may, however, also be present at second supply voltage connection 42. In other words, the second ends of first and second series circuit 17-1, 17-2 not connected to first supply voltage connection 41 are, merely by way of example, electro-conductively connected to a drain connection of a first transistor 18-1 of a current mirror circuit 18, the source connection of first transistor 18-1 of current mirror circuit 18 being electro-conductively connected to second supply voltage connection 42. The control connection of first transistor 18-1 of current mirror circuit 18 is electro-conductively connected to the control connection of a second transistor 18-2 of current mirror circuit 18, the source connection of second transistor 18-2 of current mirror circuit 18 also being electro-conductively connected to second supply voltage connection 42. The drain connection of second transistor 18-2 of current mirror circuit 18 is electro-conductively connected to its control input and via an additional transistor to first supply voltage connection 41. The outputs of first and second differential stage 1, 2 are further connected to additional current mirror circuits 37. Current mirror circuits 37 in FIG. 7, which are responsible for the decision and the hysteresis of the comparator in input stage 50 shown in FIG. 7, function as an active load. The active load also contributes to the amplification, as does the following amplifier stage/comparator stage.

In this exemplary embodiment, transistors 15-1, 15-2, 16-1, 16-2 of first and of second series circuit 17-1, 17-2 are all configured as NMOS field effect transistors. Series circuits 17-1, 17-2 may, however, also be implemented with other transistor types. Stage outputs 21, 22 of input stage 50 are further connected to additional components of LVDS receiver circuit 100.

The core of this topology are thus the three differential stages 1, 2, 3. Differential signal $V_P$–$V_N$ in this case is present directly at transistors 1-a, 1-b of first differential stage 1 and level-shifted at transistors 2-a, 2-b of second differential stage 2.

First and second differential stage 1, 2 assume the actual signal processing, i.e., effectuate a common mode suppression, a difference formation, as well as an amplification. The two resistors 32, 33 in measuring path 20 ensure the measurement of common mode voltage $V_{CM}=(V_P+V_N)/2$. This measurement is compared against a reference $V_{CM\_REF}$, which is ensured via transistors 3-1 and 3-2 of third differential stage 3. Depending on the result of the comparison, the base current provided by additional transistor 45 is either provided to transistors 1-a, 1-b of first differential stage 1 or to transistors 2-a, 2-b of second differential stage 2. In this way, it is guaranteed that the entire base current of differential stages 1, 2, 3 is independent of common mode voltage $V_{CM}$. Given a suitable dimensioning of transistors 1-a, 1-b, 2-a, 2-b of first and second differential stage 1, 2, the sum of the transconductances of these transistors 1-a, 1-b, 2-a, 2-b is also independent of common mode voltage $V_{CM}$, i.e., $G_{m1-a}+G_{m1-b}+G_{m2-a}+G_{m2-b}=Gm \neq f(V_{CM})$, $G_{m1-a}$ being the transconductance of first transistor 1-a of first differential stage 1, $G_{m1-b}$ being the transconductance of second transistor 1-b of first differential stage 1, $G_{m2-a}$ being the transconductance of first transistor 2-a of second differential stage 2, and $G_{m2-b}$ being the transconductance of second transistor 2-b of second differential stage 2.

The operating point of level-shifting circuits 15, 16, i.e., the follower circuits for the required level shifting is set by current mirror 18. Power source 18-1 ensures that the current for level-shifting circuits 15, 16 is common mode-independent. Cross-coupled transistors 15-2, 16-2, i.e., second transistors 15-2, 16-2 of first and second series circuit 17-1, 17-2 ensure that the current from first transistor 18-1 of current mirror circuit 18 is available as a function of the signal either only for second transistor 15-2 of first series circuit 17-1 or only for second transistor 16-2 of second series circuit 17-2. Thus, not only is the power consumption of level-shifting circuits 15, 16 reduced, but the otherwise unavoidable signal attenuation is also eliminated. As a consequence, the delay time and the hysteresis set with the aid of input stage 50 are independent of the common mode. The present input stage 50 is distinguished by a large input common mode range extending from $V_{ss}$ to $V_{DD}$. Provided input stage 50 is further distinguished by the common mode independence of the delay time, hysteresis and power consumption parameters.

In other words, transistors 15-1, 15-2, 16-1 and 16-2 form level-shifting circuits, which apply signals $V_P$ and $V_N$ level-shifted to the inputs of the second differential stage. Transistors 15-1 and 16-1 operate in this case as followers, whose control inputs are connected to $V_P$ and to $V_N$. At the same time, followers 15-1 and 16-1 are an active load of another differential stage, which includes two transistors 15-2 and 16-2. The shared node of the differential stage, i.e., its base point, is connected to an additional transistor 18-1. This additional transistor 18-1 is the base power source of the differential stage formed from transistor 15-1 and 16-2 and in this exemplary embodiment is the output of a current mirror 18. Transistor 18-1 forces a defined and constant current and therefore establishes both the operating points of the differential stages including transistors 15-2, 16-2, as well as the operating points of followers 15-1 and 16-1. As a result of this constant current, the power requirement of the level-shifting circuit is independent of $V_{CM}$. The differential stage directs its base current either to transistor 15-1 or to transistor 16-1 as a function of differential signal $V_P$–$V_N$. This takes place counter to the activation of followers 15-1 and 16-1. The positive feedback thus achieved eliminates virtually completely the undesirable attenuation of the level-shifting differential signal.

What is claimed is:

1. An input stage for an LVDS receiver circuit, comprising:
   at least one supply voltage connection;
   a first stage input and a second stage input to be acted upon by a differential input signal pair;
   a first differential stage and a second differential stage, each of the first and second stage inputs being directly connected to a different respective input of the first differential stage, and indirectly connected to a different respective input of the second differential stage via a different respective level-shifting circuit;
   two stage outputs, each of the outputs including a connection from one output each of the first and of the second differential stage;
   wherein each of the first differential stage and the second differential stage is connected to the supply voltage connection via a different respective transistor each of a third differential stage, a control input of one of the respective transistors of the third differential stage being connected to a measuring path, the measuring path connecting the first and second stage inputs to one another, and a control input of the other one of the respective transistors of the third differential stage being connected to a device for providing a reference voltage;
   wherein a first of the respective level-shifting circuits includes a first series circuit of two transistors each having a respective control input, wherein a first end of the first series circuit is electro-conductively connected to the supply voltage connection, wherein each of the respective control inputs of the two transistors of the first series circuit is directly electro-conductively connected to a different respective one of the first and second stage inputs, and wherein a first of the respective inputs of the second differential stage is electro-conductively connected to the first series circuit between the transistors of the first series circuit.

2. The input stage of claim 1, wherein transistors of the first differential stage and/or transistors of the second differential stage and/or the respective transistors of the third differential stage include transistors of one type, in particular, PMOS field effect transistors.

3. The input stage of claim 1, wherein the measuring path connecting the stage inputs to one another includes a series circuit of two resistors, the control input of the one of the transistors of the third differential stage connected to the measuring path being electro-conductively connected to the measuring path between the two resistors of the series circuit.

4. The input stage of claim 1, wherein current paths of the respective transistors of the third differential stage controlled by the control inputs of the respective transistors of the third differential stage are connected to the supply voltage connection via a current path of an additional transistor controlled by a control input of the additional transistor.

5. The input stage of claim 1, wherein a second of the respective level-shifting circuits includes a second series circuit of two transistors each having a respective control input, wherein a first end of the second series circuit is electro-conductively connected to the supply voltage connection, wherein each of the respective control inputs of the transistors of the second series circuit is electro-conductively connected to a different respective one of the first and second stage inputs, and wherein a second of the respective inputs of the second differential stage is electro-conductively connected to the second series circuit between the transistors of the second series circuit.

6. The input stage of claim 5, wherein a second end of the first series circuit and a second end of the second series circuit are electro-conductively connected to a current path of a transistor of a current mirror circuit controlled by a control input of the transistor of the current mirror circuit.

7. The input stage of claim 6, further comprising:
   a second supply voltage connection, the current mirror circuit being electro-conductively connected to the second supply voltage connection.

8. The input stage of claim 5, wherein the transistors of the first and/or of the second series circuit include transistors of one type, in particular, NMOS field effect transistors.

9. An LVDS receiver circuit, comprising:
   an input stage, including:
      at least one supply voltage connection;
      a first stage input and a second stage input to be acted upon by a differential input signal pair;
      a first differential stage and a second differential stage, each of the first and second stage inputs being directly connected to a different respective input of the first differential stage and indirectly connected to a different respective input of the second differential stage via a different respective level-shifting circuit;
      two stage outputs, each of the outputs including a connection from one output each of the first and of the second differential stage;
      wherein each of the first differential stage and the second differential stage is connected to the supply voltage connection via a different respective transistor each of a third differential stage, a control input of one of the respective transistors of the third different stage being connected to a measuring path, the measuring path connecting the first and second stage inputs to one another, a control input of the other one of the respective transistors being connected to a device for providing a reference voltage;
      wherein a first of the respective level-shifting circuits includes a first series circuit of two transistors each having a respective control input, wherein a first end of the first series circuit is electro-conductively connected to the supply voltage connection, wherein each of the respective control inputs of the two transistors of the first series circuit is directly electro-conductively connected to a different respective one of the first and second stage inputs, and wherein a first of the respective inputs of the second differential stage is electro-conductively connected to the first series circuit between the transistors of the first series circuit.

10. The LVDS receiver circuit of claim 9, wherein a second of the respective level-shifting circuits includes a second series circuit of two transistors each having a respective control input, wherein a first end of the second series circuit is electro-conductively connected to the supply voltage connection, wherein each of the respective control inputs of the transistors of the second series circuit is electro-conductively connected to a different respective one of the first and second stage inputs, and wherein a second of the respective inputs of the second differential stage is electro-conductively connected to the second series circuit between the transistors of the second series circuit.

11. The LVDS receiver circuit of claim 10, wherein a second end of the first series circuit and a second end of the second series circuit are electro-conductively connected to a current path of a transistor of a current mirror circuit controlled by a control input of the transistor of the current mirror circuit.

12. The LVDS receiver circuit of claim 11, wherein the input stage further includes:
   a second supply voltage connection, the current mirror circuit being electro-conductively connected to the second supply voltage connection.

* * * * *